United States Patent [19]

Furukawa et al.

[11] Patent Number: 5,230,768
[45] Date of Patent: Jul. 27, 1993

[54] METHOD FOR THE PRODUCTION OF SIC SINGLE CRYSTALS BY USING A SPECIFIC SUBSTRATE CRYSTAL ORIENTATION

[75] Inventors: Katsuki Furukawa, Sakai; Akira Suzuki; Yoshihisa Fujii, both of Nara, all of Japan

[73] Assignee: Sharp Kabushiki Kaisha, Osaka, Japan

[21] Appl. No.: 845,500

[22] Filed: Feb. 28, 1992

Related U.S. Application Data

[63] Continuation of Ser. No. 675,351, Mar. 25, 1991, abandoned.

[30] Foreign Application Priority Data

Mar. 26, 1990 [JP] Japan .................................. 2-77765
Mar. 30, 1990 [JP] Japan .................................. 2-87067

[51] Int. Cl.$^5$ .......................................... H61B 21/205
[52] U.S. Cl. .......................... 156/612; 148/DIG. 148; 148/33.1; 423/346; 427/249; 427/255.1; 437/93; 437/100
[58] Field of Search ................ 423/345, 346; 156/612; 427/249, 255, 255.1; 437/160, 93; 148/DIG. 148, 33, 33.1

[56] References Cited

U.S. PATENT DOCUMENTS

| | | |
|---|---|---|
| T951,008 | 10/1976 | Regin . |
| 3,698,944 | 10/1972 | Dyer . |
| 3,821,783 | 6/1974 | Sugita et al. . |
| 3,920,492 | 11/1975 | Sugita et al. . |
| 4,050,964 | 9/1977 | Rode . |
| 4,512,825 | 4/1985 | Addamiano et al. ................ 156/610 |
| 4,614,672 | 9/1986 | Addamiano ......................... 427/249 |
| 4,623,425 | 11/1986 | Suzuki et al. ....................... 156/613 |
| 4,855,254 | 8/1989 | Eshita et al. ....................... 437/100 |
| 4,865,659 | 9/1989 | Shigeta et al. . |
| 4,912,064 | 3/1990 | Kong et al. . |
| 5,011,549 | 4/1991 | Kong et al. . |

OTHER PUBLICATIONS

E. A. Fitzgerald, et al., Appl. Phys Lett., vol. 52, No. 18, May 2, 1989, pp. 1496–1498.

M. Shigeta, et al., Appl. Phys. Lett., vol. 55, No. 15, Oct. 9, 1989, pp. 1522–1524.
D. Dijkkamp, et al., Appl. Phys. Lett., vol. 56, No. 1, Jan. 1, 1990, pp. 39–41.
D. E. Aspnes and J. Ihm, J. Vac. Sci. Technol. B, vol. 5, No. 4, Jul./Aug. 1987, pp. 939–944.
Appl. Physc. Lett. 42(5), 1 Mar. 1983—Nishino et al. pp. 460–462.
Appl. Phys. Lett. 50(26), 29 Jun. 1987—Shibahara et al. pp. 1888–1890.
J. Mater. Res. 3(3), May/Jun. 1988—Kong et al. pp. 521–530.
J. Appl. Phys. 66(9), 1 Nov. 1989—Oshita et al. pp. 4535–3537.
Powell et al., Appl. Phys. Lett. 51(11), 14, Sep. 1987, pp. 823–825.
Zheng et al., J. Vac. Sci. Technol. A 6(3) May/Jun. 1988, pp. 696–698.
Palmour et al., J. Appl. Phys. 64(4) 15 Aug. 1988, pp. 2168–2177.
Bean et al., J. Electrochem. Soc. 114(11) Nov. 1967, pp. 1158–1161.
Liaw et al., J. Electrochem. Soc. 132(3) Mar. 1985 pp. 642–648.
Furumura et al., J. Electrochem Soc. 135(5) May 1988 pp. 1255–1260.

Primary Examiner—Olik Chaudhuri
Assistant Examiner—Ken Horton
Attorney, Agent, or Firm—David G. Conlin; Peter F. Corless

[57] ABSTRACT

There is provided a method for the production of a silicon carbide single crystal, which includes the steps of: providing a silicon single-crystal substrate having a growth plane with a crystal orientation inclined from the [100] direction toward an off-direction, wherein the crystal orientation is defined by a deviation angle $\theta$ of 5 to 40 degrees, as measured from the [011] direction toward the [01$\bar{1}$] direction, and a tilt angle $\phi$ of 1 to 7 degrees, as measured from the [100] direction toward the off-direction; and growing a silicon carbide single crystal on the substrate.

5 Claims, 4 Drawing Sheets

METHOD FOR THE PRODUCTION OF SIC SINGLE CRYSTALS BY USING A SPECIFIC SUBSTRATE CRYSTAL ORIENTATION

This is a continuation of copending application Ser. No. 07/675,351 filed on Mar. 25, 1991, now abandoned.

BACKGROUND OF THE INVENTION

1. Field of the Invention

This invention relates to a method for the production of silicon carbide single crystals, and more particularly, it relates to a method for the production of silicon carbide single crystals, by which silicon carbide single crystals not only having a high degree of surface flatness but also having stacking faults and antiphase boundaries both greatly reduced can be grown on a silicon single-crystal substrate.

2. Description of the Prior Art

Silicon carbide (SiC) is a semiconductor material having a wide band gap of 2.2 to 3.3 electron-volts (eV), and is thermally, chemically and mechanically stable and also has great resistance to radiation damage. On the other hand, there arise various problems in semiconductor devices made of conventional semiconductor materials such as silicon (Si) when they are driven under difficult conditions such as high temperatures, high output power operation, and exposure to radioactive rays. Thus, SiC can be used as a semiconductor material for semiconductor devices which are required to be driven under such difficult conditions, and accordingly these semiconductor devices can be applied to a wide variety of fields.

Despite these many advantages and capabilities, SiC has not yet been placed in actual use because the technique for growing high-quality SiC single crystals with high productivity on an industrial scale has yet to be developed.

Conventional processes for preparing SiC single crystals on a laboratory scale include growing an SiC single crystal by the use of the so-called sublimation method (i.e., the Lely method); and growing an SiC single-crystal layer by an epitaxial growth method such as chemical vapor deposition (CVD) or liquid phase epitaxy (LPE) on an SiC single-crystal substrate obtained by the Lely method. The size of the SiC single crystal thus produced by each of the conventional processes is sufficient to produce semiconductor device elements thereon.

In such conventional processes, however, the resultant single crystals are still small in size, and it is difficult to control the size and shape of each single crystal with high accuracy. Moreover, it is also difficult to control the polytype and the impurity concentration of these single crystals.

In recent years, the inventors have developed a process for growing a large-sized high-quality SiC single crystal on an inexpensive and readily-available Si single-crystal substrate by the chemical vapor deposition (CVD) technique and filed a Japanese Patent Application No. 58-76842 (76842/1983) which corresponds to U.S. Pat. No. 4,623,425. Also, another process for growing a large-sized SiC single crystal by the carbonization CVD technique is disclosed in Applied Physics Letters, 42(5), Mar. 1, 1983. This process includes heating the surface of an Si single-crystal substrate in an atmosphere containing hydrocarbon gas to form an SiC thin film thereon by carbonization and then growing an SiC single-crystal layer on the SiC thin film by the CVD method. These techniques are referred to as hetero-epitaxial growth methods in association with the growth of single-crystal layers on a single-crystal substrate which is made of a different material from that of the single-crystal layers.

In general, however, when such a hetero-epitaxial growth method is used to form an epitaxially grown layer on a single-crystal substrate, the epitaxially grown layer has a tendency to contain crystal defects, inter alia, stacking faults, because there is a difference in lattice constant, coefficient of thermal expansion, and chemical bonding between the epitaxially grown layer and the single-crystal substrate.

For example, the lattice constant of Si single crystals is different from that of SiC single crystals by as much as about 20%, so that many stacking faults arise on the {111} planes in the SiC single-crystal layer grown on the Si single-crystal substrate. Such stacking faults develop on the faces of a regular octahedron which has its one apex on the interface between the Si single-crystal substrate and the grown layer of the SiC single crystal. On the surface of the grown layer of the SiC single crystal, there appear some defect patterns, each of which has a shape corresponding to a certain section of the regular octahedron. For example, when an Si (100) substrate is used, these defect patterns take the shape of squares with their sides all parallel to the <011> direction. These stacking faults exert an adverse effect on the electronic properties of the resultant SiC single crystals. Thus, semiconductor devices with excellent device characteristics cannot be produced by using such SiC single crystals.

Furthermore, when an SiC single-crystal layer is grown on an Si (100) substrate, the resultant SiC single crystal contains crystal defects referred to as antiphase boundaries, so that semiconductor device elements cannot be formed at desired positions on the resultant SiC single-crystal substrate.

Therefore, none of the growth methods set forth above can provide SiC single crystals having these crystal defects greatly reduced, and maintain high reproducibility.

Recently, another method of growing SiC single crystals has been reported, in which an SiC single crystal is grown on an Si single-crystal substrate having a growth plane with a crystal orientation inclined from the [100] direction toward the <011> direction (e.g., toward the [011] direction or the [01$\bar{1}$] direction) (K. Shibahara, et al., Appl. Phys. Lett., 50(1987) 1888; and H. S. Kong et al., J. Mater. Res. 3(3), May/June 1988). In this method, antiphase boundaries can be removed, but the density of stacking faults cannot be reduced. Thus, there is a need for a method of producing SiC single crystals having stacking faults and antiphase boundaries both greatly reduced, with stable productivity on an industrial scale.

SUMMARY OF THE INVENTION

The method for the production of an SiC single crystal in accordance with this invention, which overcomes the above-discussed and numerous other disadvantages and deficiencies of the prior art, comprises the steps of: providing an Si single-crystal substrate having a growth plane with a crystal orientation inclined from the [100] direction toward an off-direction, wherein the crystal orientation is defined by a deviation angle $\theta$ of 5 to 40 degrees, as measured from the [011] direction toward the [01$\bar{1}$] direction, and a tilt angle $\phi$ of 1 to 7 degrees, as measured from the [100] direction toward the off-direction; and growing an SiC single crystal on the substrate.

In a preferred embodiment, the aforementioned SiC single crystal is grown by chemical vapor deposition using a silicon source gas and a carbon source gas. These source gases are introduced into the reactor tube together with a carrier gas such as hydrogen or argon. The flow rate of each source gas is preferably about 0.005% to 0.05% relative to that of carrier gas.

In a more preferred embodiment, the aforementioned silicon source gas is at least one selected from the group consisting of silane ($SiH_4$), dichlorosilane ($SiH_2Cl_2$), trichlorosilane ($SiHCl_3$), silicon tetrachloride ($SiCl_4$), trimethylchlorosilane (($CH_3$)$_3SiCl$), dimethyldichlorosilane (($CH_3$)$_2SiCl_2$), and disilane ($Si_2H_6$).

In a more preferred embodiment, the aforementioned carbon source gas is at least one selected from the group consisting of methane ($CH_4$), ethane ($C_2H_6$), propane ($C_3H_8$), acetylene ($C_2H_2$), and carbon tetrachloride ($CCl_4$).

In a more preferred embodiment, the aforementioned chemical vapor deposition is conducted while adding hydrogen chloride (HCl) gas to the source gases. The flow rate of HCl gas is preferably about 0.03% to 0.2% relative to that of carrier gas.

Thus, the invention described herein makes possible the objectives of (1) providing a method for the production of an SiC single crystal not only having a high degree of surface flatness but also having antiphase boundaries eliminated and stacking faults greatly reduced, with high reproducibility; (2) providing a method for the production of an SiC single crystal on which p-n junctions or Schottky junctions having excellent electronic properties can be formed without being adversely affected by any crystal defects; (3) providing a method for the production of an SiC single crystal which has a high degree of surface flatness so that highly-integrated device elements can readily be formed thereon by photolithography or the like; and (4) providing a method for the production of an SiC single crystal, by which SiC single crystals with excellent crystallinity can be produced with highly stable productivity, thereby enabling a high-yield and industrial-scale production of semiconductor devices (e.g., field effect transistors (FET), complementary metal oxide semiconductors (C-MOS) and other power devices) by the use of such SiC single crystals.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
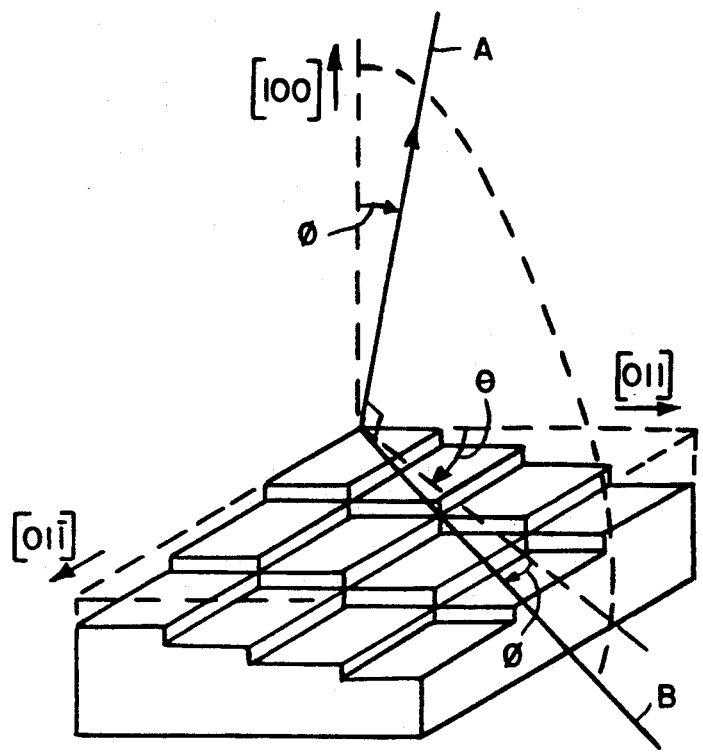
FIG. 1 is an enlarged perspective view of an Si single-crystal substrate used in a method of the present invention, showing the surface steps at the atomic level on the growth plane of the substrate and also showing a deviation angle $\theta$ and a tilt angle $\phi$ for determining the crystal orientation A of the growth plane.

In the method for the production of an SiC single crystal according to the present invention, an Si single-crystal substrate having a growth plane with a crystal orientation inclined to a predetermined direction is used (i.e., an "off-angle" substrate is used). FIG. 1 is an enlarged perspective view showing the growth plane of such an Si single-crystal substrate. As shown in FIG. 1, the growth plane of the Si single-crystal substrate has a crystal orientation A inclined from the [100] direction toward the direction of inclination of the growth plane, i.e., an off-direction B, and also has surface steps at the atomic level along the off-direction B. The crystal orientation A is uniquely defined by a deviation angle $\theta$, which is as measured from the [011] direction toward the [01$\bar{1}$] direction, and a tilt angle $\phi$, which is as measured from the [100] direction toward the off-direction B.

The Si single-crystal substrate used in the present invention has a crystal orientation A with a deviation angle $\theta$ of 5 to 40 degrees and a tilt angle $\phi$ of 1 to 7 degrees. The use of such a substrate makes it possible to produce an SiC single crystal which involves no problems associated with antiphase boundaries, attains a high degree of surface flatness, and has few stacking faults. Using such an SiC single crystal having excellent crystallinity, a high-quality SiC semiconductor device can be manufactured. This is because antiphase boundaries can be eliminated and stacking faults in the SiC single crystal can be reduced to such a level as to exert no adverse effect on the electronic properties of the device elements produced thereon.

In cases where an Si single-crystal substrate having a growth plane with an inclined crystal orientation is used for growing an SiC single crystal, however, since the growth plane of the Si single-crystal substrate has surface steps at the atomic level, the SiC single crystal grown thereon has a tendency to have a rough surface corresponding to the surface steps of the Si single-crystal substrate. When p-n junctions or Schottky junctions are formed on the SiC single crystal with a rough surface so as to produce a semiconductor device, the electrical characteristics of the resultant p-n junctions or Schottky junctions deteriorate due to the rough surface of the SiC single crystal. Furthermore, it is difficult to produce highly-integrated semiconductor devices by using SiC single crystals with a rough surface. In this way, the use of an Si single-crystal substrate having a growth plane with an inclined crystal orientation attains the reduction of antiphase boundaries and stacking defects in the resultant SiC single crystal, but roughness may remain on the surface of the grown SiC single crystal, which will lower the electrical characteristics of device elements to be produced thereon.

In the growth of an SiC single crystal on an Si single-crystal substrate, Si is first bound to C, which is then bound to Si, and these bounding processes are repeated so that Si and C are alternately positioned. During the growth, there may arise Si-Si bonds or C-C bonds, which constitute Si or C dimers at that site. These dimers function as impurities, which reduce the rate of crystal growth in the areas around the dimers. This is considered as a principal reason for the roughness on the surface of the grown SiC single crystal. These impurities tend to appear on the edge portions of each surface step on the growth plane of the Si single-crystal substrate.

In the method of the present invention, HCl gas is preferably added to the source gases used in chemical vapor deposition for growing SiC single crystals. The addition of HCl gas reduces the generation of the above-mentioned Si and C dimers, which eliminates the possibility of causing roughness on the surface of the resultant SiC single crystal.

The addition of HCl gas to the source gases has been proposed for the improvement in crystal quality of an SiC single crystal grown at low temperatures on an Si single-crystal substrate having a growth plane, the crystal orientation of which is not inclined (Y. Ohshita, J. Appl. Phys., 66(9), Nov. 1, 1989). This method, however, does not involve the elimination of the above-mentioned problem associated with Si and C dimers in cases where SiC single crystals are grown on an Si single-crystal substrate having a growth plane with an inclined crystal orientation.

The invention will be further illustrated by reference to the following examples, but these examples are not intended to restrict the present invention.

EXAMPLE 1

First, Si single-crystal substrates having a growth plane with a crystal orientation A inclined from the [100] direction toward the off-direction B (i.e., "off-angle" substrates), as shown in FIG. 1, were provided. A deviation angle $\theta$ of the crystal orientation A was set at 10, 20, 30, or 40 degrees (in addition, 0 or 45 degrees for comparison), while a tilt angle $\phi$ was set at 1, 2, 3, 5 or 7 degrees (in addition, 0 or 9 degrees for comparison). That is, forty-two kinds of Si single-crystal substrates each having one of the above deviation angles in combination with one of the above tilt angles were prepared.

Figure 2:
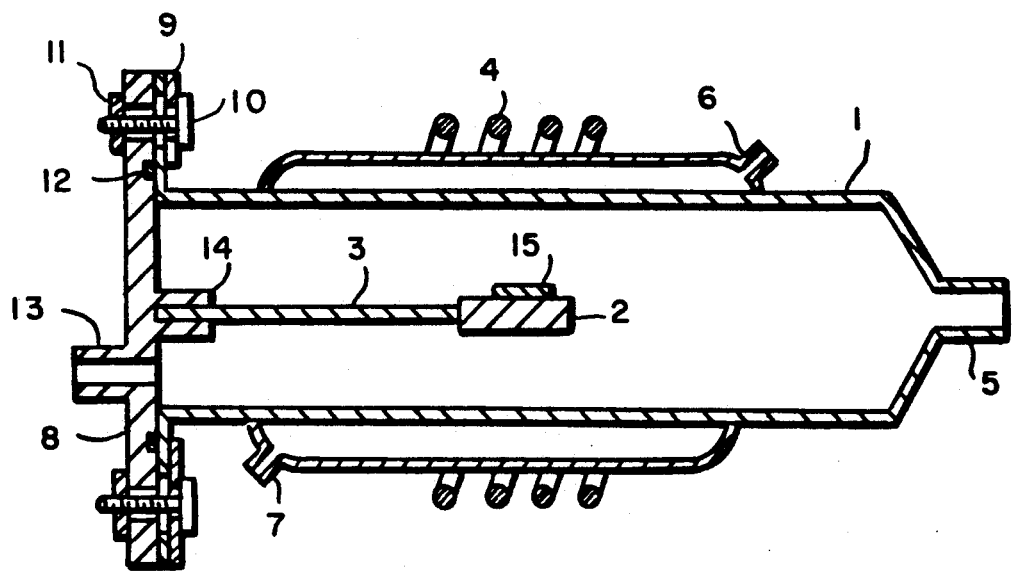
FIG. 2 is a sectional view showing an apparatus used for growing SiC single crystals according to the present invention.

FIG. 2 shows an apparatus which can be used for growing SiC single crystals in the method of the present invention. The apparatus has a water-cooled quartz reactor tube 1, in which a graphite susceptor 2 coated with silicon carbide is located by being supported on a graphite support rod 3. The graphite susceptor 2 may be kept either horizontal or inclined to a given direction. Around the reactor tube 1 is wound a working coil 4, through which a radio-frequency current is passed to heat the susceptor 2 to a desired temperature. One end of the reactor tube 1 is provided with a branch tube 5 functioning as a gas inlet. The outer tube of the reactor tube 1 has branch tubes 6 and 7, through which cooling water is supplied thereinto. The other end of the reactor tube 1 is sealed with a flange 8 of stainless steel by means of a holding plate 9, bolts 10, nuts 11 and an O-ring 12 all provided in the circumferential portion of the flange 8. The flange 8 is provided with a branch tube 13 in its center, which functions as a gas outlet.

The above-mentioned apparatus was used for growing SiC single crystals on an Si single-crystal substrate, as described below.

First, an Si single-crystal substrate 15 was placed on the susceptor 2. While a carbon source gas of acethylene ($C_2H_2$) and a carrier gas of hydrogen ($H_2$) were being fed to the reactor tube 1 through the branch tube 5 at flow rates of 0.9 SCCM and 3 SLM, respectively, a radio-frequency current was passed through the working coil 4 to heat the susceptor 2 and raise the temperature of the Si single-crystal substrate 15 to 1,350° C. The substrate 15 was kept at this temperature for two minutes, thereby carbonizing the surface of the Si single-crystal substrate 15, resulting in an SiC single-crystal thin film thereon.

Next, a silicon source gas was fed together with a carbon source gas and a carrier gas into the reactor tube 1, thereby growing an SiC single crystal on the SiC single-crystal film formed on the Si single-crystal substrate 15. Disilane ($Si_2H_6$) was used as the silicon source gas and acethylene ($C_2H_2$) was used as the carbon source gas. The flow rate of each source gas was 0.9 SCCM. Hydrogen ($H_2$) was used as the carrier gas, the flow rate of which was 3 SLM. The temperature of the Si single-crystal substrate 15 was kept at 1,350° C. The period of time for the growth was two hours. As a result, an SiC single crystal having a thickness of 15 $\mu$m was obtained.

Figure 3:
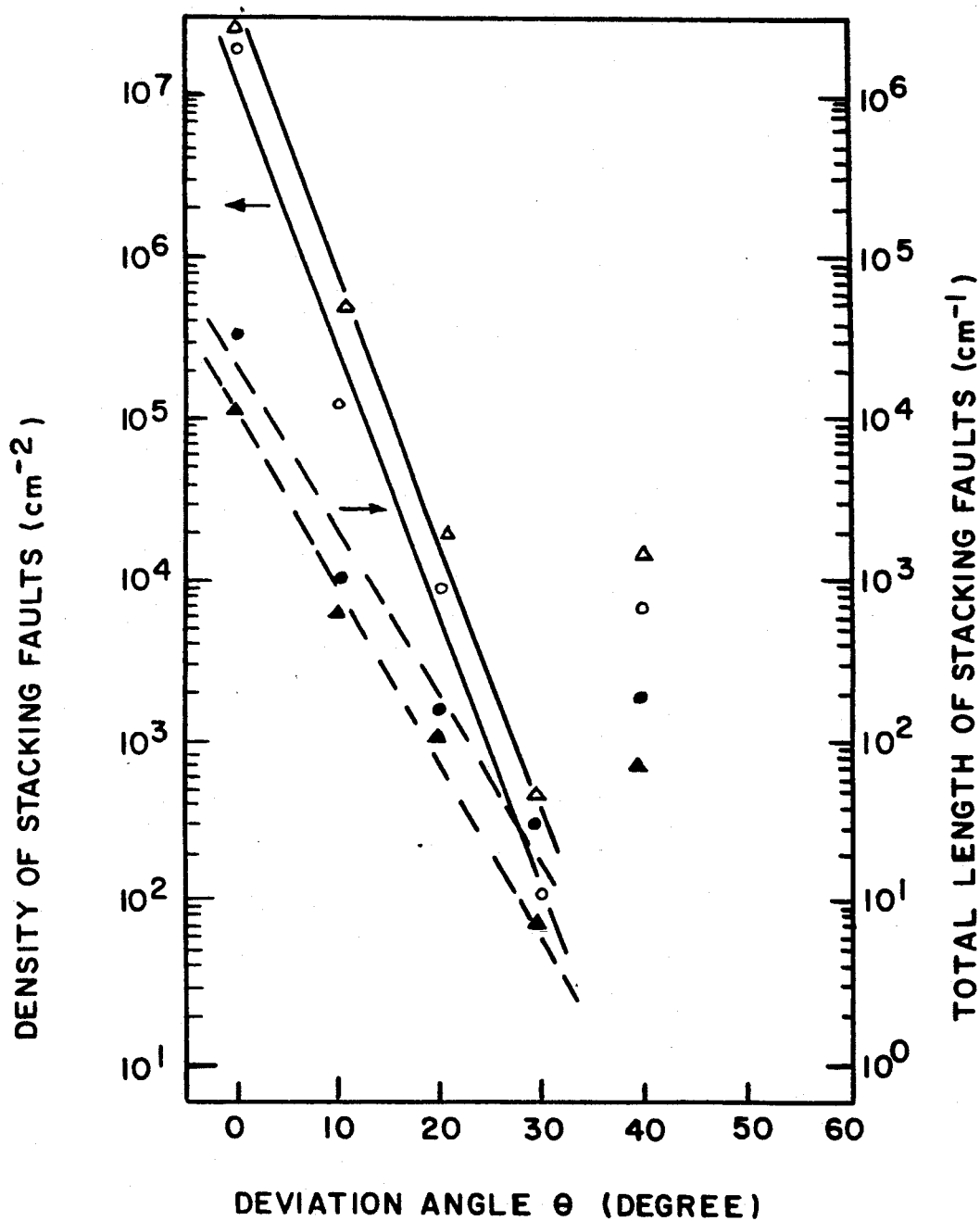
FIG. 3 is a graph showing the density and total length of stacking faults with respect to each deviation angle $\theta$ in each of various SiC single crystals prepared according to the present invention.

The resultant SiC single crystals were examined by an electron microscope to determine the presence of antiphase boundaries and stacking defects on the surface of each single crystal. FIG. 3 shows the density and total length of stacking faults per unit area on the surface of each of the SiC single crystals produced on the above-mentioned Si single-crystal substrates having a growth plane with a crystal orientation defined by a deviation angle $\theta$ of 0, 10, 20, 30 or 40 degrees and a tilt angle $\phi$ of 2 or 7 degrees. In this figure, the open circle "○" and the open triangle "△" represent the densities of stacking faults on the surface of SiC single crystals grown on the Si single-crystal substrates having a growth plane with a crystal orientation defined by tilt angles $\phi$ of 2 and 7 degrees, respectively, while the filled circle "●" and the filled triangle "▲" represent the total lengths of stacking faults per unit area on the surface of the SiC single crystals grown on the Si single-crystal substrates having a growth plane with a crystal orientation defined by tilt angles $\phi$ of 2 and 7 degrees, respectively.

As can be seen from FIG. 3, whether the tilt angle $\phi$ of the crystal orientation A was 2 or 7, the density of stacking faults was greatly reduced with an increase in the deviation angle $\theta$. Similarly, the total length of stacking faults per unit area was greatly reduced with an increase in the deviation angle $\theta$. This tendency was observed in case of other tilt angles $\phi$.

In general, when the tilt angle $\phi$ of the crystal orientation A was 1 to 7 degrees and the deviation angle $\theta$ was 5 to 40 degrees, no antiphase boundaries arose and the density of stacking faults was greatly reduced, and good results as shown in FIG. 3 were obtained.

On the other hand, with respect to the SiC single crystal grown on the Si substrate having a growth plane with a deviation angle $\theta$ of zero degree, which was prepared for comparison, the density of stacking faults was high and many stacking faults having a long length were found. In the case where the deviation angle $\theta$ was 45 degrees, it was impossible to measure the density of stacking faults because a number of antiphase boundaries existed on the surface of the SiC single crystal.

When the tilt angle $\phi$ of the crystal orientation A was more than 7 degrees, roughness was observed on the surface of the grown SiC single crystal. When the tilt angle $\phi$ was less than 1 degree, e.g., zero degree (that is, when an Si (100) substrate was used), many antiphase boundaries arose, which lowered the electronic properties of the grown SiC single crystal.

In this way, the use of an Si single-crystal substrate having a growth plane with a crystal orientation A defined by a deviation angle $\theta$ of 5 to 40 degrees and a tilt angle $\phi$ of 1 to 7 degrees can result in the production of an SiC single crystal not only having a high degree of surface flatness but also having antiphase boundaries eliminated and stacking faults greatly reduced.

EXAMPLE 2

In this example, HCl gas was added to source gases in order to obtain an SiC single crystal having a high degree of surface flatness as well as greatly reduced antiphase boundaries and stacking faults.

First, an Si single-crystal substrate having a growth plane with a crystal orientation A inclined from the [100] direction toward the off-direction B (i.e., "off-angle" substrate), as shown in FIG. 1, was provided. The deviation angle $\theta$ was set at 26.5 degrees and the tilt angle $\phi$ was set at 4.5 degrees. These angles correspond to the case where a crystal orientation A is inclined from the [100] direction to the [011] direction and the [0$\bar{1}$1] direction at angles of 2 and 4 degrees, respectively.

Then, using the apparatus shown in FIG. 2, an SiC single crystal was grown on the Si single-crystal substrate by chemical vapor deposition, as described below.

The Si single-crystal substrate 15 was placed on the susceptor 2. While a carbon source gas of propane ($C_3H_8$) and a carrier gas of hydrogen ($H_2$) were being fed to the reactor tube 1 through the branch tube 5 at flow rates of 0.2 SCCM and 3 SLM, respectively, a radio-frequency current was passed through the working coil 4 to heat the susceptor 2 and raise the temperature of the Si single-crystal substrate 15 to 1,350° C. The Si single-crystal substrate 15 was kept at this temperature for two minutes, thereby carbonizing the surface of the Si single-crystal substrate 15, resulting in an SiC single-crystal thin film.

Thereafter, a silicon source gas, a carbon source gas and a carrier gas were fed together with HCl gas into the reactor tube 1, thereby growing an SiC single crystal on the SiC single-crystal thin film formed on the Si single-crystal substrate 15. Silane ($SiH_4$) was used as the silicon source gas and propane ($C_3H_8$) as the carbon source gas, the flow rate of each source gas being set at 0.2 SCCM. Hydrogen ($H_2$) was used as the carrier gas, the flow rate of which was 3 SLM. The flow rate of HCl gas was 3 SCCM. Under these conditions, the temperature of the Si single-crystal substrate 15 was kept at 1,350° C. for two hours. As a result, an SiC single crystal having a thickness of 5 $\mu$m was obtained.

The resultant SiC single crystal had a high degree of surface flatness; the surface roughness was about 5 nm. In contrast, the surface roughness of an SiC single crystal prepared in the same manner as described above except for no addition of HCl gas was about 100 nm. The SiC single crystal prepared by the method of Example 2 was also examined by an electron microscope, the results of which indicated that the SiC single crystal was substantially free from antiphase boundaries and stacking faults.

Figure 4:
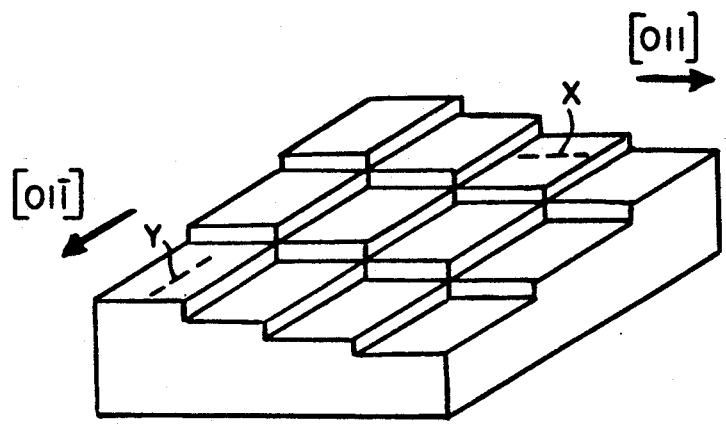
FIG. 4 is an enlarged perspective view of an Si single-crystal substrate having a growth plane with an inclined crystal orientation, showing the surface steps at the atomic level on the substrate and also showing stacking faults X and Y generated in the [011] and [01$\bar{1}$] directions, respectively.

The addition of HCl gas can improve the degree of surface flatness for the following reason: As shown in FIG. 4, when an SiC single crystal is grown on an Si single-crystal substrate having surface steps at the atomic level on the growth plane thereof, stacking faults X and Y arise on surface steps each having a (100) plane in the <011> direction (e.g., in the [011] direction and the [01$\bar{1}$] direction, respectively). The stacking faults X and Y are broken at the edge portions of the respective surface steps, so that the length of each stacking fault becomes short. Because of their shorter length, the stacking faults X and Y have a larger energy and become unstable, resulting in that they disappear as the crystal growth proceeds. This makes possible the production of an SiC single crystal substantially free from not only antiphase boundaries but also stacking faults.

Furthermore, when using no HCl gas in growing an SiC single crystal on an Si single-crystal substrate, Si and C atoms are different in probability of sticking to the Si single-crystal substrate, i.e., the sticking probability of Si atoms is larger than that of C atoms, so that the growth rate differs from one surface step to another, resulting in an SiC single crystal having a surface with roughness corresponding to the surface steps of the Si single-crystal substrate. The addition of HCl gas to the source gases prevents the generation of Si-Si dimers caused by unnecessary sticking of Si atoms, thereby reducing the roughness on the surface of the grown SiC single crystal. In this way, the resultant SiC single crystal has a high degree of surface flatness.

Figure 5:
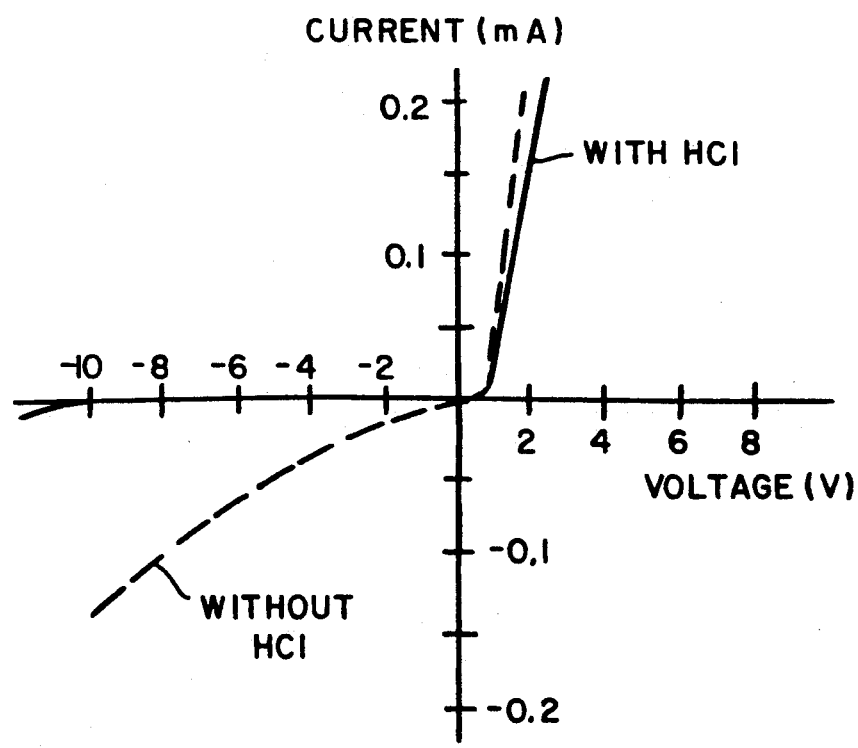
FIG. 5 is a graph showing the electrical characteristics of a Schottky diode produced using an SiC single crystal prepared with HCl gas addition according to the present invention, and also showing the electrical characteristics of a Schottky diode produced using an SiC single crystal prepared by a conventional method.

The SiC single crystal thus obtained by the method of Example 2 was used for the production of a Schottky diode. The electrical characteristics of the Schottky diode are shown by the solid line in FIG. 5. The dotted line in this figure shows the electrical characteristics of a Schottky diode which was produced using an SiC single crystal prepared in the same manner as in Example 2 except for no addition of HCl gas. As can be seen from the figure, the addition of HCl gas to the source gases made it possible to produce a Schottky diode with a greatly reduced reverse leak current. This indicates that the addition of HCl gas contributes to not only the reduction in antiphase boundaries and in stacking faults but also the improvement in the degree of surface flatness.

In order to examine the effect attained by the addition of HCl gas with respect to the flow rate thereof, SiC single crystals were grown by addition of HCl gas at different flow rates, and the stacking fault densities of the resultant SiC single crystals were measured. An Si single-crystal substrate having a growth plane with a crystal orientation A defined by a deviation angle $\theta$ of 30 degrees and a tilt angle $\phi$ of 3 degrees was used as a substrate for the crystal growth. The flow rates of carbon source gas and silicon source gas were both 0.9 SCCM, while the flow rate of carrier gas was 3 SLM.

Figure 6:
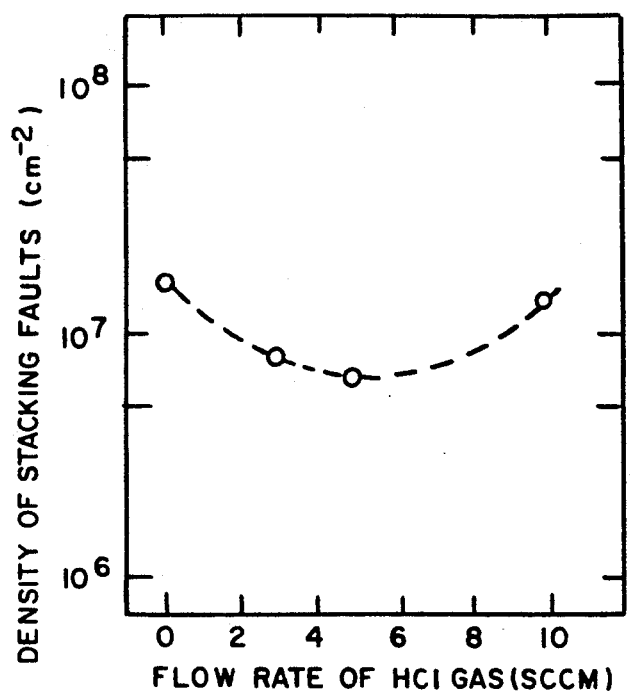
FIG. 6 is a graph showing the density of stacking faults on the surface of an SiC single crystal with respect to each of the different flow rates of HCl gas, in a method of the present invention.

The results are shown in FIG. 6. As can be seen from the figure, the stacking faults of the SiC single crystal were greatly reduced when HCl gas was added to the source gases at a flow rate in a certain range. For the purpose of attaining a high degree of surface flatness, the flow rate of HCl gas is typically in the range of 1 to 7 SCCM, when the flow rate of carrier gas is 3 SCCM. That is, the flow rate of HCl gas is preferably in the range of about 0.03% to 0.2% relative to that of carrier gas.

Figure 7A:
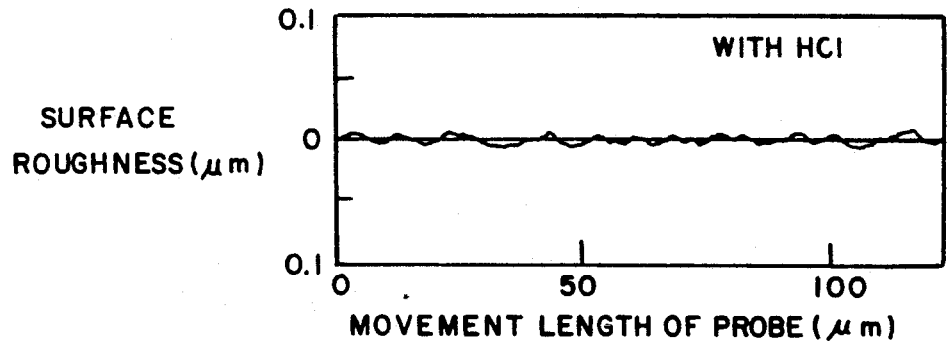
FIG. 7A is a graph showing the surface roughness of an SiC single crystal prepared with HCl gas addition according to the present invention.
Figure 7B:
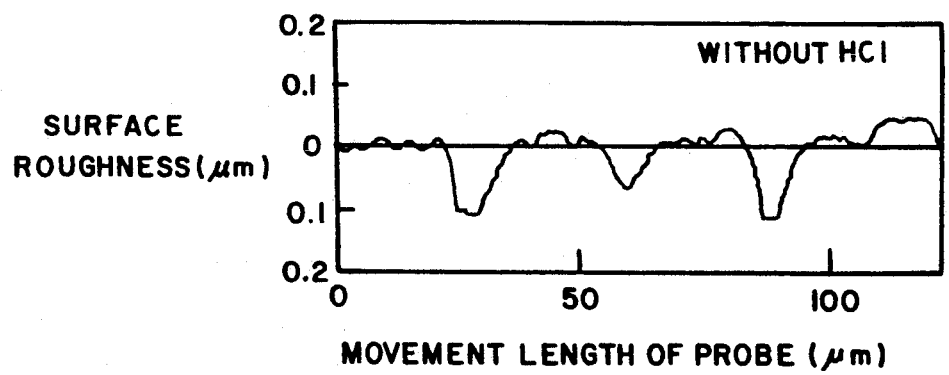
FIG. 7B is a graph showing the surface roughness of an SiC single crystal prepared without HCl gas addition.

In order to examine the effect that the addition of HCl gas has on the surface roughness, the SiC single crystals grown as described above were measured using a probe with respect to their surface roughness. The results obtained with HCl gas addition at a flow rate of 5 SCCM are shown in FIG. 7A. For comparison, the results obtained without HCl gas addition are shown in FIG. 7B. The basis for plotting the surface roughness values was set at an appropriate position on the ordinate. As can be seen from these figures, the SiC single crystal grown without HCl gas addition had some grooves about 0.1 $\mu$m in depth on the surface thereof, whereas the SiC single crystal grown with HCl gas addition had an extremely flat surface, indicating that the surface roughness thereof was significantly reduced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of a silicon carbide single crystal, comprising the steps of:
   providing a silicon single-crystal substrate having a growth plane with a crystal orientation inclined from the [100] direction toward the direction of inclination of the growth plane, wherein said crystal orientation is defined by a deviation angle $\theta$ of 5 to 40 degrees, as measured form the [011] direction toward the [01$\bar{1}$] direction, and a tilt angle $\phi$ of 1 to 7 degrees, as measured from the [100] direction toward the direction of inclination of the growth plane and
   growing a silicon carbide single crystal on said substrate.

2. A method for the production of a silicon carbide single crystal according to claim 1, wherein said silicon carbide single crystal is grown by chemical vapor deposition using a silicon source gas and a carbon source gas.

3. A method for the production of a silicon carbide single crystal according to claim 2, wherein said silicon source gas is at least one selected form the group consisting of silane ($SiH_4$), dichlorosilane ($SiH_2Cl_2$), trichlorosilane ($SiHCl_3$), silicon tetrachloride ($SiCl_4$), trimethylchlorosilane (($CH_3$)$_2SiCl$), dimethyldichlorosilane (($CH_3$)$_2SiCl_2$), and disilane ($Si_2H_6$).

4. A method for the production of a silicon carbide single crystal according to claim 2, wherein said carbon source gas is at least one selected from the group consisting of methane ($CH_4$), ethane ($C_2H_6$), propane ($C_3H_8$), acetylene ($C_2H_2$), and carbon tetrachloride ($CCl_4$).

5. A method for the production of a silicon carbide single crystal according to claim 2, wherein hydrogen chloride gas is added to said source gasses.

* * * * *